United States Patent
Ahn et al.

(10) Patent No.: US 9,469,917 B2
(45) Date of Patent: Oct. 18, 2016

(54) DOPANT FEEDER OF IGNOT GROWING APPARATUS

(75) Inventors: Jin-Woo Ahn, Daejeon (KR);
Bong-Woo Kim, Gyeongbuk (KR);
Il-Soo Choi, Gyeongbuk (KR);
Do-Yeon Kim, Daegu (KR)

(73) Assignee: LG SILTRON INC., Gyeongsangbuk-do (KR)

( * ) Notice: Subject to any disclaimer, the term of this patent is extended or adjusted under 35 U.S.C. 154(b) by 319 days.

(21) Appl. No.: 13/821,004

(22) PCT Filed: Aug. 10, 2012

(86) PCT No.: PCT/KR2012/006415
§ 371 (c)(1),
(2), (4) Date: Mar. 19, 2014

(87) PCT Pub. No.: WO2013/025024
PCT Pub. Date: Feb. 21, 2013

(65) Prior Publication Data
US 2014/0190397 A1     Jul. 10, 2014

(30) Foreign Application Priority Data
Aug. 12, 2011 (KR) .................. 10-2011-0080639

(51) Int. Cl.
| | | |
|---|---|---|
| *C30B 15/04* | (2006.01) | |
| *C30B 29/06* | (2006.01) | |
| *C30B 15/32* | (2006.01) | |

(52) U.S. Cl.
CPC ............... *C30B 15/04* (2013.01); *C30B 15/32* (2013.01); *C30B 29/06* (2013.01); *Y10T 117/1032* (2015.01)

(58) Field of Classification Search
CPC ....... C30B 15/00; C30B 15/02; C30B 15/04; C30B 15/20; C30B 15/32; C30B 29/00; C30B 29/02; C30B 29/06; C30B 31/00; C30B 31/04; Y10T 117/00; Y10T 117/10; Y10T 117/1016; Y10T 117/1024; Y10T 117/1032; Y10T 117/1056
USPC .......... 117/11, 13, 19, 21, 35, 200, 206, 208, 117/214, 911, 928, 931, 932
See application file for complete search history.

(56) References Cited

U.S. PATENT DOCUMENTS 5,976,245 A * 11/1999 Aydelott ................. C30B 15/04
                                                        117/19
8,409,347 B2     4/2013   Kawazoe et al.
(Continued)

FOREIGN PATENT DOCUMENTS

| CN | 1056135 | 11/1991 |
|---|---|---|
| CN | 1285009 | 2/2001 |

(Continued)

OTHER PUBLICATIONS

Chinese Patent Application No. 2012-80039532.5 Office Action dated Sep. 2, 2015.
(Continued)

*Primary Examiner* — Kenneth A Bratland, Jr.
(74) *Attorney, Agent, or Firm* — Lewis Roca Rothgerber Christie LLP

(57) ABSTRACT

Provided is an ingot growing apparatus, which includes a crucible containing a silicon melt, a pulling device pulling a silicon single crystal ingot grown from the silicon melt, and a dopant supply unit disposed adjacent to the pulling device and for supplying a dopant during growing of the ingot. The neck portion may be doped at a concentration higher than that of the ingot through the dopant supply unit. Therefore, dislocation propagation velocity may be decreased and a propagation length may be shortened.

12 Claims, 8 Drawing Sheets

(56) References Cited

U.S. PATENT DOCUMENTS

2003/0061985 A1    4/2003   Kulkarni et al.
2004/0069214 A1*   4/2004   Choi .................. C30B 15/04
                                                        117/213

FOREIGN PATENT DOCUMENTS

| CN | 202131395 | 2/2012 |
| JP | H05-201790 | 8/1993 |
| JP | 2002-220297 | * 8/2002 |
| JP | 2002255684 | 9/2002 |
| JP | 2004-137140 | 5/2004 |
| JP | 2008-087981 | 4/2008 |
| KR | 100777336 | 11/2007 |
| KR | 1020110086976 | 8/2011 |
| WO | WO 98/35074 | 8/1998 |

OTHER PUBLICATIONS

PCT International Search Report for PCT/KR2012/006415 mailed Feb. 28, 2013.

* cited by examiner

DOPANT FEEDER OF IGNOT GROWING APPARATUS

CROSS-REFERENCE TO RELATED APPLICATIONS

The present application is a national phase application of P.C.T. application PCT/KR2012/006415 filed Aug. 10, 2012, which claims the priority benefit of Korean patent application 10-2011-0080639 filed Aug. 12, 2011, the disclosures of which are incorporated herein by reference.

BACKGROUND OF THE INVENTION

1. Field of the Invention

The present disclosure relates to an ingot growing apparatus and a method of manufacturing an ingot.

2. Description of the Related Art

In general, a process of manufacturing a wafer for fabricating a semiconductor device may include a cutting process slicing a silicon single crystal ingot, an edge grinding process rounding an edge of the sliced wafer, a lapping process planarizing a rough surface of the wafer due to the cutting process, a cleaning process removing various contaminants including particles adhered to the surface of the wafer during the edge grinding or lapping process, a surface grinding process for securing shape and surface suitable for post-processing, and an edge polishing process for a wafer edge.

A silicon single crystal ingot may be grown through a Czochralski (CZ) method or floating zone (FZ) method. In general, a silicon single crystal ingot is grown by using the Czochralski method, which may manufacture a large diameter silicon single crystal ingot and has low processing cost.

The Czochralski method may be performed by immersing a seed crystal in a silicon melt and pulling the seed crystal at a low speed.

The seed crystal at a low temperature is in contact with the high-temperature silicon melt to thus generate a thermal shock. Shear stress may be generated in the single crystal ingot due to the thermal shock and the shear stress generates dislocations in the single crystal. The dislocations due to the thermal shock may be removed through a neck portion forming process.

A typical neck portion forming process is a technique removing dislocations by reducing shear stress through decreasing a diameter of the neck portion and increasing a crystal growth rate higher than a dislocation propagation velocity, which was suggested by Dash in the 1950s. The neck portion forming process technique disclosed so far has been performed such that a diameter of the neck portion is 5 mm or less and a crystal growth rate is 3 mm/min or more. However, since the generated shear stress increases as the diameter of the neck portion increases, the dislocation propagation velocity is more increased, and thus, it is difficult to remove dislocations in the neck portion having a diameter of 5 mm or more by simply increasing the crystal growth rate of the neck portion. A limit of the diameter able to control dislocations by a general neck portion forming process is known to be 5 mm or less.

However, it is estimated that a weight of a 450 mm crystal in the future may reach about 1 ton and it is impossible to support the heavy weight (>500 kg) of the 450 mm crystal by using the present process of forming a neck portion having a diameter of about 5 mm.

That is, since it is expected that the weight may be closed to 1 ton when a large diameter single crystal is grown in the future, there is a need for a process of forming a neck portion having a diameter able to support the heavy weight.

SUMMARY OF THE CLAIMED INVENTION

Technical Problem

Embodiments provide a method of growing a high-quality silicon ingot.

Solution to Problem

In one embodiment, an ingot growing apparatus includes: a crucible containing a silicon melt; a pulling device pulling a silicon single crystal ingot grown from the silicon melt; and a dopant supply unit disposed adjacent to the pulling device and for supplying a dopant during growing of the ingot.

In another embodiment, a method of manufacturing an ingot includes: preparing a silicon melt; forming a neck portion from the silicon melt; and growing an ingot from the silicon melt, wherein a dopant is provided in the forming of the neck portion.

Advantageous Effects of Invention

An ingot manufacturing apparatus according to an embodiment includes a dopant supply unit supplying a dopant to a neck portion. The neck portion may be doped at a concentration higher than that of an ingot through the dopant supply unit. Therefore, dislocation propagation velocity may be decreased and a propagation length may be shortened. That is, since defects may be quickly controlled and dislocation propagation may be controlled, the neck portion having a large diameter may be secured. Since the diameter of the neck portion becomes large, weight of the ingot that may be supported by the neck portion may increase. That is, a heavy weight ingot may be supported. Therefore, a high-quality, large diameter wafer may be manufactured.

Also, a method of manufacturing an ingot according to an embodiment may support a large-sized heavy weight ingot by increasing the diameter of the neck portion. That is, the method may prevent process failure and may improve process yield.

DETAILED DESCRIPTION

Mode for the Invention

Figure 1:
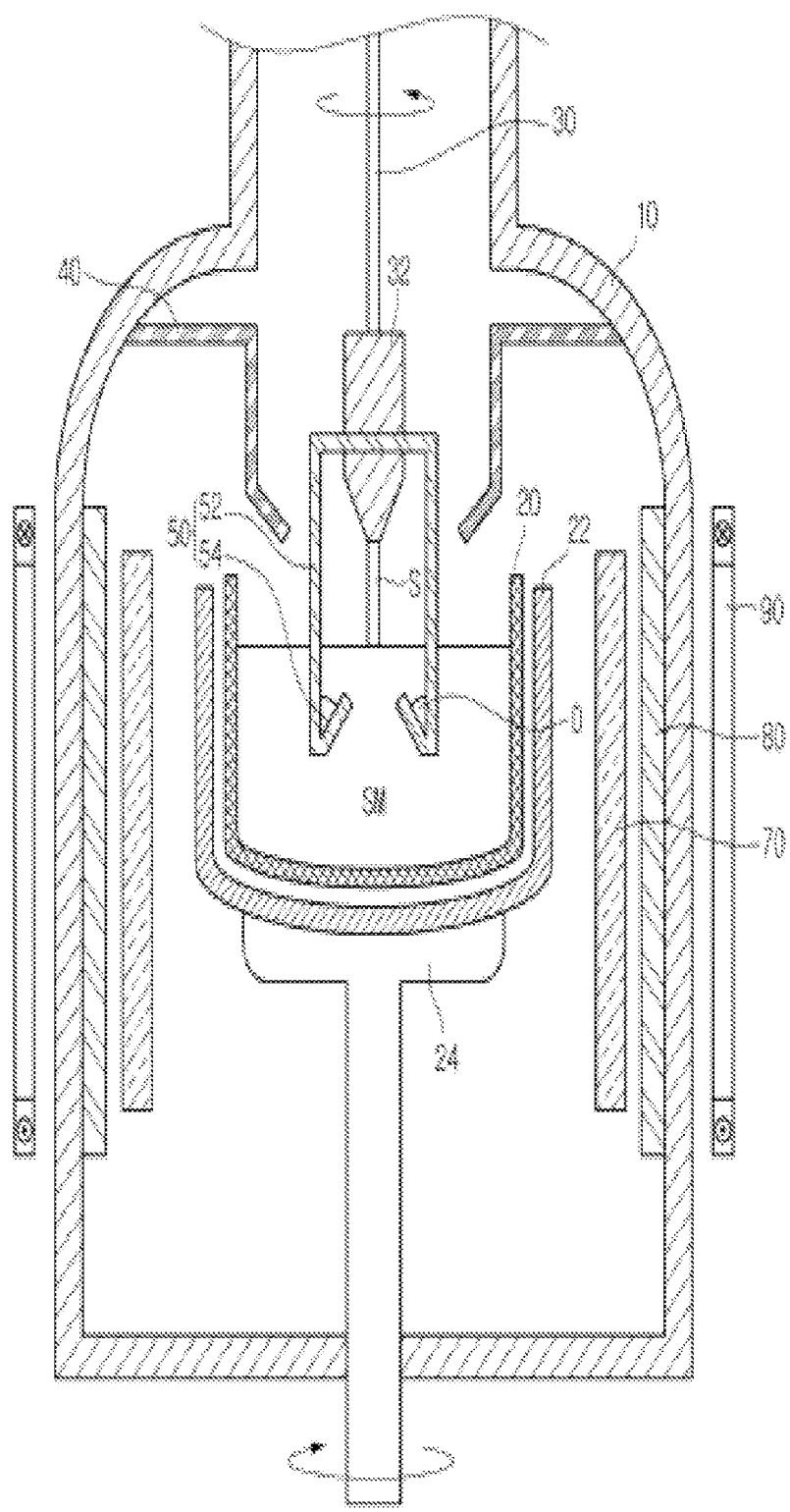
FIG. 1 is a cross-sectional view illustrating an ingot manufacturing apparatus according to an embodiment.

In the description of embodiments, it will be understood that when a layer (or film), region, pattern or structure is referred to as being 'on/over' or 'under/below' another layer (or film), region, pad or pattern, it can be directly on the other layer or substrate, or intervening layers may also be present. Further, the reference about 'on/over' or 'under/below' each layer will be made on the basis of drawings.

In the drawings, the thickness or size of each layer (or film), region, pattern or structure may be modified for convenience in description and clarity, and does not entirely reflect an actual size.

Hereinafter, embodiments of the present invention will be described in detail with reference to the accompanying drawings.

Figure 2:
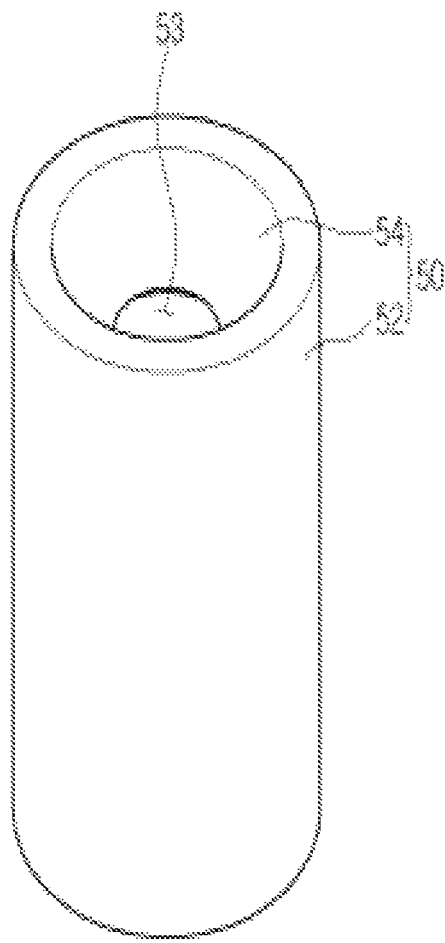
FIG. 2 is a perspective view illustrating a dopant supply unit included in the ingot manufacturing apparatus according to the embodiment.
Figure 3:
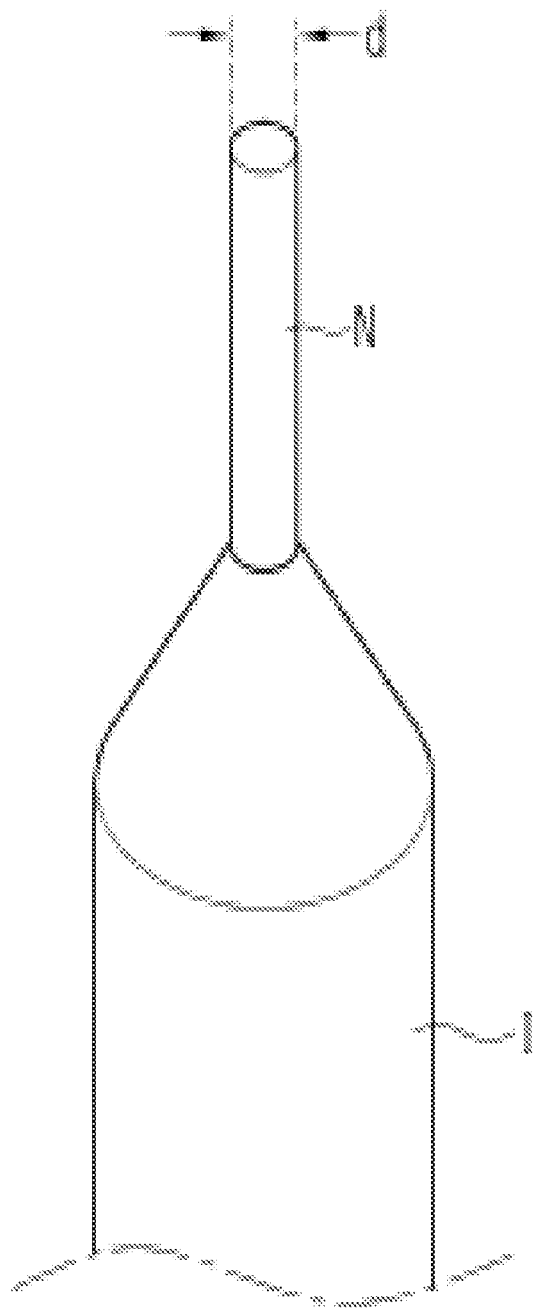
FIG. 3 is a perspective view illustrating an ingot manufactured by the ingot manufacturing apparatus according to the embodiment.
Figure 4:
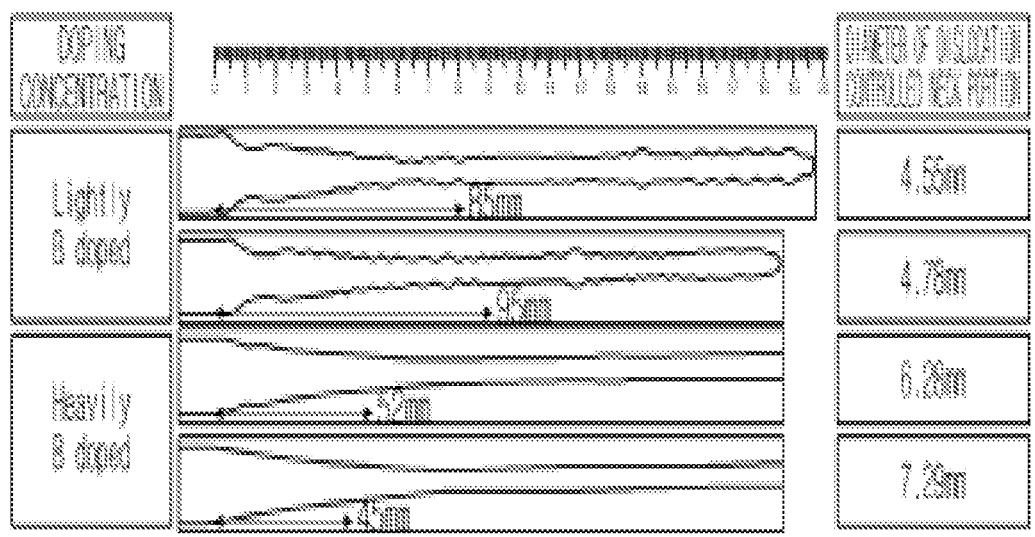
FIG. 4 is the result of analyzing a dislocation propagation length according to a doping concentration.
Figure 5:
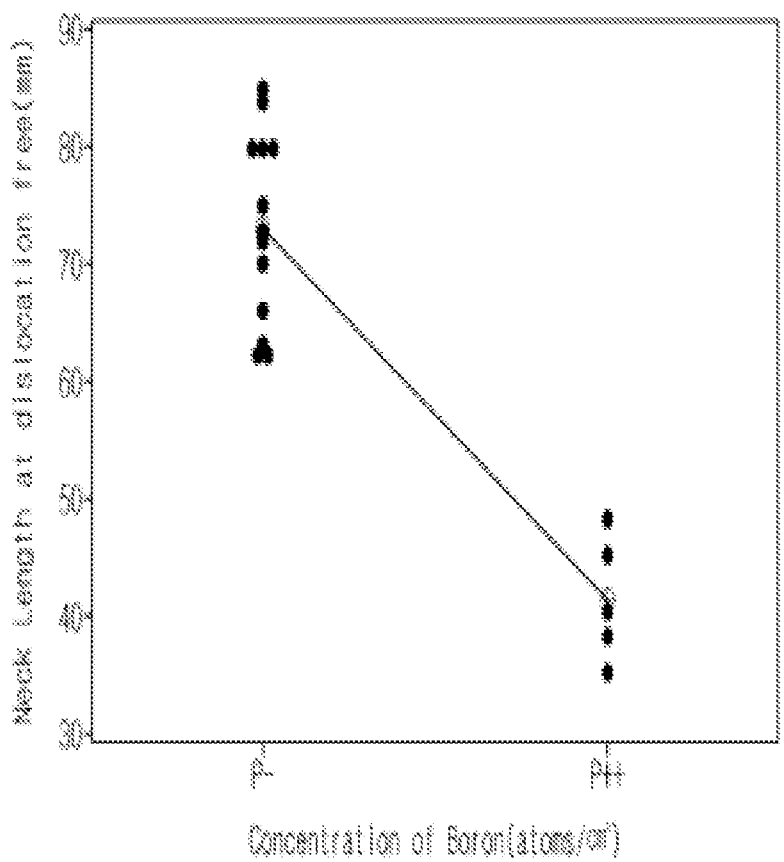
FIG. 5 is a graph showing a length of a neck portion according to the doping concentration.
Figure 6:
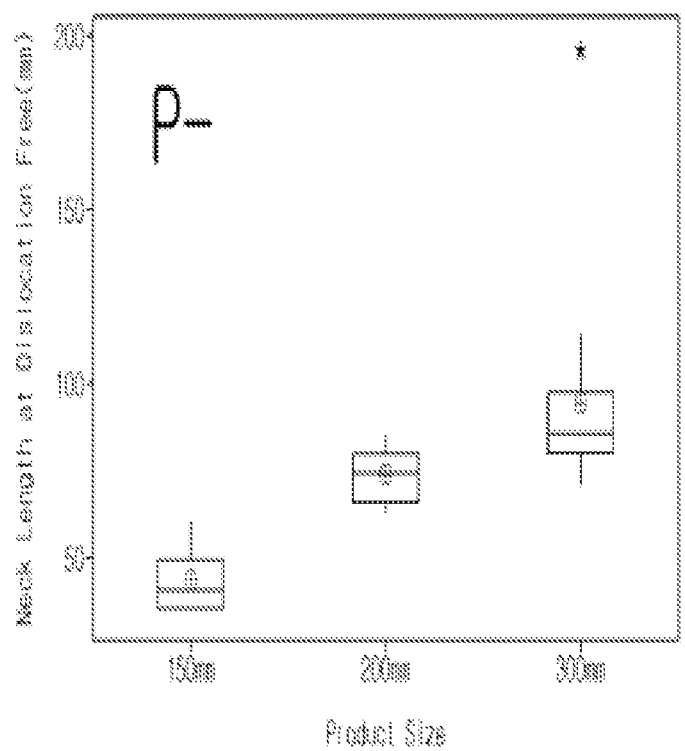
FIG. 6 is a graph showing the length of the neck portion according to a size of the ingot when the doping concentration is low.
Figure 7:
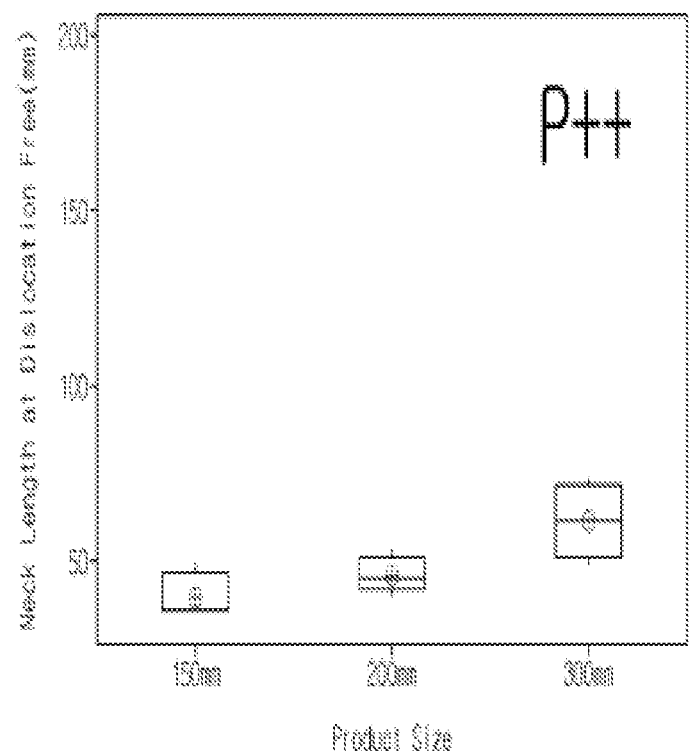
FIG. 7 is a graph showing the length of the neck portion according to the size of the ingot when the doping concentration is high.

A silicon single crystal ingot manufacturing apparatus according to an embodiment is described in detail with reference to FIGS. 1 through 7. FIG. 1 is a cross-sectional view illustrating an ingot manufacturing apparatus according to an embodiment. FIG. 2 is a perspective view illustrating a dopant supply unit included in the ingot manufacturing apparatus according to the embodiment. FIG. 3 is a perspective view illustrating an ingot manufactured by the ingot manufacturing apparatus according to the embodiment. FIG. 4 is the result of analyzing a dislocation propagation length according to a doping concentration. FIG. 5 is a graph showing a length of a neck portion according to the doping concentration. FIG. 6 is a graph showing the length of the neck portion according to a size of the ingot when the doping concentration is low. FIG. 7 is a graph showing the length of the neck portion according to the size of the ingot when the doping concentration is high.

Referring to FIG. 1, the silicon single crystal ingot manufacturing apparatus according to the embodiment may be a manufacturing apparatus used for a Czochralski (CZ) method among methods of manufacturing a silicon wafer.

The silicon single crystal ingot manufacturing apparatus according to the embodiment includes a chamber 10, a quartz crucible 20 able to contain a silicon melt SM, a crucible support 22, a crucible rotation axis 24, a pulling device 30 pulling an ingot, a seed chuck 32 holding a seed crystal S, a dopant supply unit 50, a heat shield 40 shielding heat, a resistance heater 70, an insulator 80, and a magnetic field generating apparatus 90.

The foregoing will be described in more detail below.

As shown in FIG. 1, the quartz crucible 20 is installed in the chamber 10 and the crucible support 22 supporting the quartz crucible 20 may be installed. The silicon melt SM is contained in the quartz crucible 20. The quartz crucible 20 may include quartz and the crucible support 22 may include graphite.

The quartz crucible 20 may be rotated in a clockwise or anti-clockwise direction by the crucible rotation axis 24. The pulling device 30 having the seed crystal S attached thereto and pulling the seed crystal S is positioned at an upper portion of the quartz crucible 20, and the pulling device 30 may be rotated in a direction opposite to the rotation direction of the crucible rotation axis 24.

The pulling device 30 may include the seed chuck 32. The seed chuck 32 may hold the seed crystal S.

The seed crystal S attached to the seed chuck 32 is immersed in the silicon melt SM and then the pulling device 30 is pulled as well as being rotated to grow a silicon single crystal. Thus, a silicon single crystal ingot may be manufactured.

Specifically, an ingot growing process may include a neck portion N forming operation growing a single crystal having a long and thin shape, i.e., a neck portion N, a shouldering forming operation enlarging a diameter of the neck portion N up to a target diameter, a body growing operation growing a silicon single crystal ingot I in an axis direction while maintaining the target diameter, and a tailing operation separating the silicon single crystal ingot I from the silicon melt SM. A wafer may be manufactured by slicing the silicon single crystal ingot I through the foregoing growing process.

The dopant supply unit 50 for supplying a dopant into the silicon melt SM may be provided in the ingot growing apparatus. A dopant may be introduced into the ingot I by the dopant supply unit 50 during growing of the ingot I. Accordingly, electrical properties of the wafers manufactured from the ingot I may be adjusted. The dopant may vary according to types of the manufactured wafers. For example, when the wafer is an N-type, the dopant may be phosphorus (P). As another example, when the wafer is a P-type, the dopant may be boron (B).

The dopant supply unit 50 may supply a dopant D to the neck portion N first grown from the seed crystal S. That is, the supply of the dopant by the dopant supply unit 50 may be used in the neck portion forming operation.

The dopant supply unit 50 may be positioned adjacent to the pulling device 30. Specifically, the dopant supply unit 50 may be positioned adjacent to the seed chuck 32. More particularly, the dopant supply unit 50 may be positioned by surrounding the seed crystal S.

Referring to FIGS. 1 and 2, the dopant supply unit 50 may include an outer wall 52 and an accommodating portion 54. The outer wall 52 may surround the seed crystal S. The accommodating portion 54 may extend from the outer wall 52 to the inside at a predetermined angle. Also, the accommodating portion 54 may accommodate the dopant D. That is, the dopant D may be directly loaded on the accommodating portion 54. The accommodating portion 54 may be inclined from the outer wall 52. Therefore, the accommodating portion 54 may provide the dopant D to the neck portion N by minimizing diffusion of the melted dopant D.

The accommodating portion 54 includes a through hole 53 and the neck portion N may penetrate through the through hole 53. Since the diameter of the neck portion N may be enlarged therethrough, a large-sized heavy weight ingot may be supported.

However, the embodiment is not limited thereto and the dopant supply unit 50 may have a wafer shape. That is, the dopant supply unit 50 may be a dopant wafer.

The dopant supply unit 50 may be fixed to the pulling device 30. Specifically, the dopant supply unit 50 may be fixed to the seed chuck 32. Therefore, the pulling device 30 is lifted and thus, the dopant supply unit 50 may be lifted together. That is, it is possible to prevent the dopant supply unit 50 from providing the dopant D during the growth of the ingot.

The dopant supply unit 50 may provide the dopant D having a concentration higher than a dopant concentration in the silicon melt SM. Specifically, the dopant supply unit 50 may provide the dopant D having a concentration range of $1 \times 10^{16}$ atoms/cm$^3$ to $1 \times 10^{19}$ atoms/cm$^3$. More particularly, the dopant supply unit 50 may provide the dopant D having a concentration range of $1\times10^{17}$ atoms/cm$^3$ to $1\times10^{18}$ atoms/cm$^3$. When the dopant supply unit 50 provides the dopant D having a concentration greater than $1\times10^{19}$ atoms/cm$^3$, dislocations propagated in a crystal growth direction may be generated due to lattice misfit.

The neck portion N may be doped at a concentration higher than that of the ingot I through the dopant supply unit 50. Therefore, dislocation propagation velocity may be decreased and a propagation length may be shortened. Therefore, the neck portion N having a large diameter d may be secured. Specifically, referring to FIG. 3, the neck portion N having a diameter d of 5 mm or more may be provided. Since the diameter d of the neck portion N increases, weight of the ingot I, which may be supported by the neck portion N, may increase. That is, a heavy weight ingot may be supported.

Referring to FIG. 4, it may be understood that the dislocation propagation length is very long at 85 mm and 95 mm when the doping concentration of the neck portion N is low. Also, it may be understood that the diameter d of the neck N at a point having dislocations controlled is small respectively at 4.55 mm and 4.78 mm when the doping concentration of the neck portion N is low. In contrast, it may be understood that when the doping concentration of the neck portion N is high, the dislocation propagation length becomes very short at 52 mm and 45 mm in comparison to those of the low doping concentration. Also, when the doping concentration of the neck portion N is high, it may be understood that the diameter d of the neck N at the point having dislocations controlled becomes very large respectively at 6.28 mm and 7.29 mm in comparison to those of the low doping concentration. Herein, the high doping concentration is referred to the case in which the neck portion N is provided with the dopant D having a concentration range of $1\times10^{17}$ atoms/cm$^3$ to $1\times10^{18}$ atoms/cm$^3$ through the dopant supply unit 50.

Referring to FIG. 5, when P++ boron is doped, a length of the neck portion N at the point having dislocations controlled is measured to be 50 mm or less. In contrast, when P− boron is doped, the length of the neck portion N at the point having dislocations controlled is measured to be 60 mm or more. That is, it may be understood that the higher the doping level is, the faster the defects may be controlled.

Referring to FIGS. 6 and 7, it may be also understood that the length of the neck portion N at the point having dislocations controlled becomes short according to a size of the ingot, when the doping level is high in comparison to the case of low doping level.

Therefore, when the doping concentration is high, the defects may be quickly controlled and dislocation propagation may be controlled, and thus, the neck portion N having an increased diameter d may be grown and a heavy weight ingot may be supported through the neck portion N. Therefore, a high-quality, large diameter wafer may be prepared.

Next, the resistance heater 70 applying heat to the quartz crucible 20 may be positioned adjacent to the crucible support 22. The insulator 80 may be positioned outside the resistance heater 70. The resistance heater 70 supplies heat required for melting polycrystalline silicon to make the silicon melt SM and continuously supplies heat to the silicon melt SM during the manufacturing process.

Meanwhile, the silicon melt SM contained in the quartz crucible 20 is at a high temperature and thus, heat may be dissipated from an interface of the silicon melt SM. At this time, when a large amount of heat is dissipated, an appropriate temperature of the silicon melt SM required for growing a silicon single crystal ingot may be difficult to be maintained. Therefore, the heat dissipated from the interface must be minimized and the dissipated heat must not be transferred to an upper portion of the silicon single crystal ingot. For this purpose, the heat shield 40 is installed such that the silicon melt SM and the interface of the silicon melt SM are maintained in a high-temperature environment.

The heat shield 40 may have various shapes so as to allow stable crystal growth to be performed by maintaining a thermal environment in a desired state. For example, the heat shield 40 may have a hollow cylinder shape so as to surround the silicon single crystal ingot I. Examples of the heat shield 40 may be graphite, a graphite felt, or molybdenum.

The magnetic field generating apparatus 90 able to control convection of the silicon melt SM by applying a magnetic field to the silicon melt SM may be positioned outside the chamber 10. The magnetic field generating apparatus 90 may generate a magnetic field (MF) in a direction perpendicular to the crystal growth axis of the silicon single crystal ingot, i.e., a horizontal magnetic field.

Figure 8:
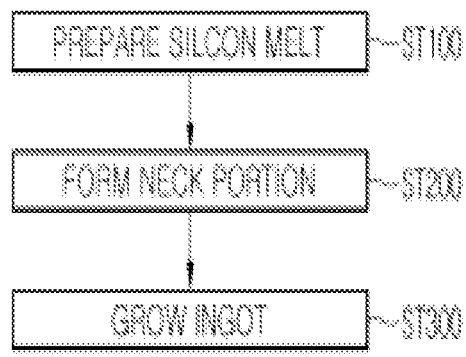
FIG. 8 is a flowchart for explaining a method of manufacturing an ingot according to an embodiment.

Hereinafter, a method of manufacturing an ingot according to an embodiment will be described with reference to FIG. 8. Detailed descriptions that are the same as or similar to the foregoing descriptions will not be provided. FIG. 8 is a flowchart for explaining a method of manufacturing an ingot according to an embodiment.

Referring to FIG. 8, the method of manufacturing an ingot according to the embodiment includes a silicon melt preparing operation ST100, a neck portion forming operation ST200, and an ingot growing operation ST300.

In the silicon melt preparing operation ST100, a silicon melt may be prepared in a quartz crucible installed in a chamber.

Next, a single crystal neck portion having a thin and long shape may be formed from a seed crystal in the neck portion forming operation ST200. The seed crystal at a low temperature is in contact with the high-temperature silicon melt to thus generate a thermal shock. Shear stress may be generated in the single crystal ingot due to the thermal shock and the shear stress generates dislocations in the single crystal. The dislocations due to the thermal shock may be removed through the neck portion forming operation ST200.

A dopant may be provided in the neck portion forming operation ST200. The high-concentration dopant having a concentration range of $1\times10^{16}$ atoms/cm$^3$ to $1\times10^{19}$ atoms/cm$^3$ may be provided. As a result, the neck portion having dislocation propagation controlled therein may be provided. Also, dislocation propagation is controlled and thus, a diameter of the neck portion may be enlarged. At this time, the diameter of the neck portion may be 5 mm or more. The diameter of the neck portion is enlarged and thus, a large-sized heavy weight ingot may be supported. That is, process failure may be prevented and process yield may be improved.

The ingot growing operation ST300 may include a shouldering forming operation enlarging the diameter of the neck portion up to a target diameter and a body growing operation growing a silicon single crystal ingot in an axis direction while maintaining the target diameter.

The characteristics, structures, and effects described above are included in at least one embodiment and are not limited to only one embodiment. Furthermore, it will be understood by those of ordinary skill in the art that various changes in form and details may be made therein without departing from the spirit and scope of the present invention as defined by the following claims.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

The embodiment may be used for an ingot growing apparatus and thus, has industrial applicability.

What is claimed is:

1. A dopant feeder of an ingot growing apparatus, the dopant feeder comprising:
   a crucible containing a silicon melt;
   a pulling device comprising a seed chuck for holding a seed crystal at a lower side of the pulling device, the pulling device being to pull a silicon single crystal ingot grown from the silicon melt; and
   a dopant supply unit combined with the pulling device and to supply a dopant during growing of the ingot, wherein the dopant supply unit comprises:
   an upper wall combined with the seed chuck,
   an outer wall extended downwardly from a circumference of the upper wall to surround the seed crystal, and
   an accommodating portion extended from a lower edge of the outer wall toward an inside region of the dopant supply unit defined by the upper wall and the outer wall, the accommodating portion extending at a set upward-sloping angle to accommodate the dopant and comprising a through-hole to permit penetration of the dopant supply unit by a neck portion of the ingot.

2. The dopant feeder of the ingot growing apparatus according to claim 1, wherein the dopant supply unit is to provide a dopant having a concentration higher than a dopant concentration in the silicon melt.

3. The dopant feeder of the ingot growing apparatus according to claim 2, wherein the dopant supply unit is to provide a dopant having a concentration range of $1\times10^{16}$ atoms/cm$^3$ to $1\times10^{19}$ atoms/cm$^3$.

4. The dopant feeder of ingot growing apparatus according to claim 3, wherein the dopant supply unit is to provide a dopant having a concentration range of $1\times10^{17}$ atoms/cm$^3$ to $1\times10^{18}$ atoms/cm$^3$.

5. The dopant feeder of the ingot growing apparatus according to claim 1, wherein the dopant supply unit is fixed to the pulling device.

6. The dopant feeder of the ingot growing apparatus according to claim 1, wherein the dopant provided in the ingot through the dopant supply unit is phosphorus or boron.

7. A dopant feeder of an ingot growing apparatus, the dopant feeder comprising:
   an upper wall to be combined with a seed chuck of a pulling device of an ingot growing apparatus;
   an outer wall extended downwardly from a circumference of the upper wall to surround a seed crystal held by the seed chuck; and
   an accommodating portion extended from a lower edge of the outer wall toward an inside region of the dopant feeder defined by the upper wall and the outer wall, the accommodating portion extending at an upward-sloping angle to accommodate a dopant and comprising a through-hole to permit penetration of the dopant feeder by a neck portion of an ingot grown in the ingot growing apparatus.

8. The dopant feeder according to claim 7, wherein the dopant has a concentration higher than a dopant concentration in a silicon melt positioned in the ingot growing apparatus.

9. The dopant feeder according to claim 7, wherein the dopant has a concentration range of $1\times10^{16}$ atoms/cm$^3$ to $1\times10^{19}$ atoms/cm$^3$.

10. The dopant feeder according to claim 9, wherein the dopant has a concentration range of $1\times10^{17}$ atoms/cm$^3$ to $1\times10^{18}$ atoms/cm$^3$.

11. The dopant feeder according to claim 7, wherein the dopant feeder is to be fixed to the seed chuck of the pulling device.

12. The dopant feeder according to claim 7, wherein the dopant comprises phosphorus or boron.

* * * * *